United States Patent [19]
Voldman

[11] Patent Number: 5,789,964
[45] Date of Patent: Aug. 4, 1998

[54] DECOUPLING CAPACITOR NETWORK FOR OFF-STATE OPERATION

[75] Inventor: Steven H. Voldman, South Burlington, Vt.

[73] Assignee: International Business Machines Corporation, Armonk, N.Y.

[21] Appl. No.: 800,312

[22] Filed: Feb. 14, 1997

[51] Int. Cl.$^6$ .................... H03K 17/16; H03K 17/687
[52] U.S. Cl. .................. 327/380; 327/387; 327/389; 327/391; 327/427; 327/434; 327/437
[58] Field of Search .................. 327/376, 377, 327/387, 388, 389, 391, 427, 434, 435, 437, 34, 36, 385, 380, 111

[56] References Cited

U.S. PATENT DOCUMENTS

| | | | |
|---|---|---|---|
| 2,534,902 | 12/1950 | Cuttino . | |
| 2,609,501 | 9/1952 | Guthrie, Jr. | 327/34 |
| 2,615,962 | 10/1952 | Cuttino . | |
| 2,857,587 | 10/1958 | Tollefson et al. | 327/35 |
| 2,987,633 | 6/1961 | Pallas | 327/34 |
| 3,277,311 | 10/1966 | Merlen et al. | 327/34 |
| 3,584,239 | 6/1971 | Christenson | 327/111 |
| 4,012,667 | 3/1977 | Ishida et al. | 361/16 |
| 4,028,592 | 6/1977 | Fahlen et al. | 361/16 |
| 4,543,594 | 9/1985 | Mohsen et al. | 357/51 |
| 5,394,294 | 2/1995 | Mei et al. | 361/275.3 |
| 5,506,457 | 4/1996 | Krauter et al. | 307/129 |
| 5,555,148 | 9/1996 | Matsuzaki et al. | 361/15 |

OTHER PUBLICATIONS

IBM Technical Disclosure Bulletin; Dynamic Logic Protection Circuit; vol. 33; No. 1A; Jun., 1990; pp. 242–244.
IBM Technical Disclosure Bulletin; Dynamic Integrated Circuit Power Protection; vol. 33, No. 1B; Jun. 1990; pp. 82–85.
IBM Technical Disclosure Bulletin; Limiting the Short–Circuit Current in Defective Integrated Decoupling Capacitors; vol. 33, No. 6B; Nov., 1990; pp. 47–49.

IBM Technical Disclosure Bulletin; Efficient Power–Supply Decoupling Scheme for Dynamic RAMs; vol. 33, No. 12; May, 1991.

IBM Technical Disclosure Bulletin; Decoupling Circuit Structure to Reduce Electrical Noise; vol. 37, No. 9; Sep., 1994, 593–594.

*Primary Examiner*—Timothy P. Callahan
*Assistant Examiner*—An T. Luu
*Attorney, Agent, or Firm*—Whitham, Curtis & Whitham; Eugene Schkurko, Esq.

[57] ABSTRACT

Decoupling capacitors are activated by high current impulses that occur due to electrical over stress or electrostatic discharge, which occurs when the chip is powered off with no additional control signal or feedback elements. The high current or high voltage impulse is used to activate a rise time network, which turns on an electric switch, enabling the capacitor network. The basic circuit can be modified to address the situation where a failed decoupling capacitor needs to be switched out. In this modification, there is in addition to the three basic elements listed above, a feedback element connected between the decoupling capacitor and the switch. This feedback element operates to turn the electronic switch off when the decoupling capacitor is leaky. A further modification of the basic invention allows the decoupling capacitor to be used as a decoupling transistor during chip operation and as a capacitor during electrostatic discharge (ESD) testing or an ESD event.

21 Claims, 8 Drawing Sheets

DECOUPLING CAPACITOR NETWORK FOR OFF-STATE OPERATION

BACKGROUND OF THE INVENTION

1. Field of the Invention

The present invention generally relates to high speed integrated circuit (IC) chips which experience large changes in current or voltage from external signals when the chip is in an un-powered state and, more particularly, to providing additional capacitance to be activated for improvement in actual pin electrostatic discharge robustness and in preventing electrical over voltage of internal circuitry.

2. Background Description

Standard decoupling capacitors are implemented into advanced semiconductor chips between the Vdd and Vss power rails for improving ΔI noise when a chip is in functional operation. In high performance chips where there are large changes in current as circuits switch, it has become necessary to add capacitance to limit ΔI noise. This capacitance is added using capacitors with normal thin oxide devices. However, defects in the oxide and yield implications require the utilization of either an electronic switch or other means (e.g., a programmable fuse) to isolate the defective capacitor. Decoupling capacitors consist of a gate structure placed on an n-well. The decoupling capacitor is isolated from the substrate Vss power rail by an electronic switch controlled by a control signal CPOR (capacitor power-on-reset). The electronic switch consists of an n-channel MOSFET (metal oxide semiconductor field effect transistor) structure. During chip power up, the CPOR signal is asserted, turning on the n-channel MOSFET and switching on the decoupling capacitor. An example of this structure is shown in U.S. Pat. No. 5,506,457 to Krauter et al. and assigned to the assignee of this invention. However, when the semiconductor chip is un-powered in the Krauter et al. circuit, the decoupling capacitor's electronic switch is "open", preventing usage of the decoupling capacitance for over voltage conditions in un-powered states.

SUMMARY OF THE INVENTION

It is therefore an object of the present invention to provide additional decoupling capacitors which can be activated to establish an improved C dV/dt, to reduce ΔI, and to establish a lower voltage on the power rails of the chip.

According to the invention, decoupling capacitors are activated by high current impulses that occur due to electrical over stress or electrostatic discharge, which occurs when the chip is powered off with no additional control signal or feedback elements. The high current or high voltage impulse is used to activate a rise time network, which turns on an electric switch, enabling the capacitor network.

In this invention, the decoupling capacitor is activated to allow for a large current shunt between the Vdd and Vss power supply rails. It is the intent of the invention to produce a decoupling capacitance between the Vdd and Vss power supply rails to allow for an increase in effective chip capacitance to limit the rise of the Vdd power supply to avoid over voltage of circuits on the Vdd power supply rail. It is also the intent of the invention to establish a discharge path between the Vdd and Vss power supply rails via a capacitive network. The invention in its basic form comprises the following elements:

1. A decoupling capacitor comprising a polysilicon gate and a well structure, where the gate is the first electrode and the well is the second electrode. The first electrode is attached to the Vdd power supply rail.

2. An electronic switch, comprising a field effect transistor (FET), connected between the Vss power supply rail and the second electrode of the decoupling capacitor. The FET may be either a p-channel or n-channel MOSFET device.

3. A resistor/capacitor (RC) rise time network having an input connected to the Vdd power supply rail and an output connected to the gate of the FET transistor switch. The RC network can be fabricated as a resistor element in the form of an "on" MOSFET, interconnect wiring, or any doped implant (n-well, p-well, n+, p+, or gated buried resistor) and a capacitor in the form of any capacitive network (MOSFET, gated buried resistor, metal capacitor, trench capacitor, or any decoupling capacitor).

When the chip powers up, the resistor element allows the gate of the electronic switch to follow the Vdd power supply rail. For transient pulses, faster than the RC rise time, the RC network acts as a filter allowing the electronic switch to be pulled to a ground potential by the capacitor C of the RC network allowing the electronic switch to be turned on. The switching of the electronic switch then allows a decrease in the impedance in series with the decoupling capacitor enabling the capacitor element. If the RC time is greater than 100 nanoseconds, in a human body model (HBM) impulse, the decoupling capacitor will be activated, allowing an increase in the total chip capacitance and increasing C dV/dt. This limits the voltage of the power supply, allowing an improvement in actual pin electrostatic discharge robustness and in preventing electrical over voltage of internal circuitry.

The basic invention can be modified to address the situation where a failed decoupling capacitor needs to be switched out. In this modification, there is in addition to the three basic elements listed above, a feedback element connected between the decoupling capacitor and the switch. This feedback element operates to turn the electronic switch off when the decoupling capacitor is leaky. A further modification of the basic invention allows the decoupling capacitor to be used as a decoupling capacitor during chip operation and as a capacitor during electrostatic discharge (ESD) testing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
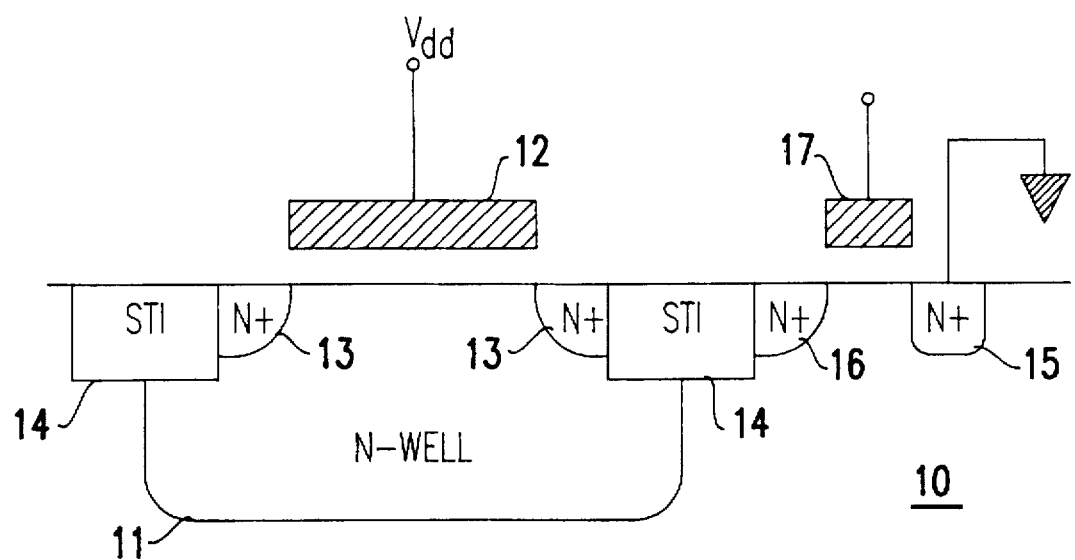
FIG. 1 is a cross-sectional view of a prior art decoupling capacitor and electronic switch structure.

Referring now to the drawings, and more particularly to FIG. 1, there is shown a cross-sectional view of a prior art decoupling capacitor and electronic switch structure formed in an epitaxial silicon layer 10 on a substrate. The capacitor is composed of an n-well 11 formed in the epitaxial layer 10 and a polysilicon gate 12 formed over the n-well between n+ and shallow trench isolation (STI) regions 13 and 14. A field effect transistor (FET) is formed in the epitaxial layer 10 comprising n+ source and drain regions 15 and 16 and a polysilicon gate 17. The gate 12, comprising one plate of the capacitor, is connected to the Vdd power supply rail of the chip, and the source region 15 of the electronic switch is connected to the Vss power supply rail of the chip.

Figure 2:
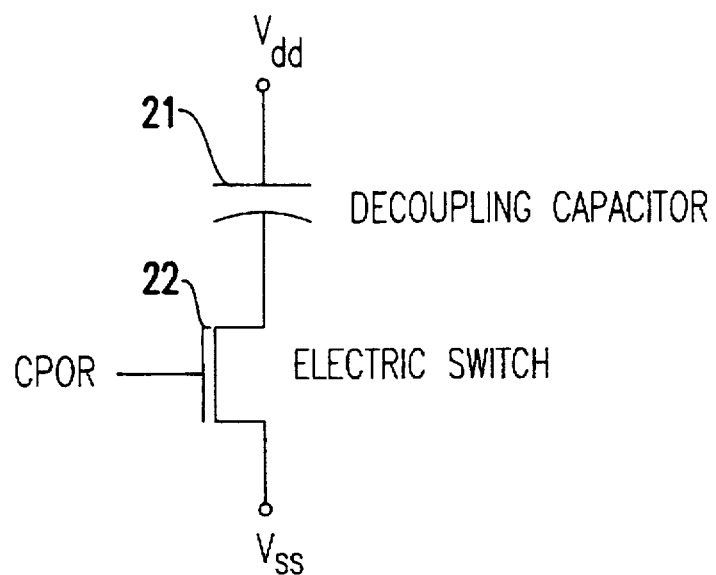
FIG. 2 is a schematic diagram of the prior art decoupling capacitor and electronic switch structure of FIG. 1.

The schematic diagram of the structure of FIG. 1 is shown in FIG. 2. The circuit comprises the decoupling capacitor 21 connected between the Vdd power supply rail and the drain of n-channel MOSFET device 22 (or NFET). The source of NFET 22 is connected to the Vss power supply rail. The gate of NFET 22 is connected to receive the CPOR signal on power up to activate the decoupling capacitor 21.

Figure 3:
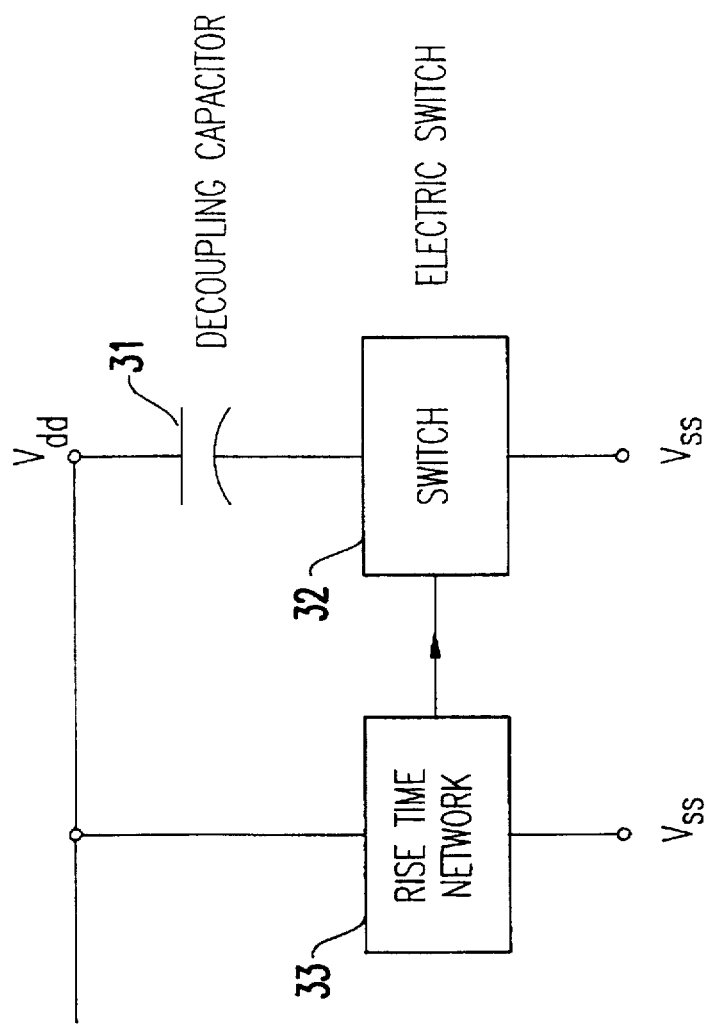
FIG. 3 is a block and schematic diagram of the decoupling capacitor, electronic switch and rise time network according to the invention.

FIG. 3 illustrates the basic components of the decoupling capacitor network according to the present invention. The decoupling capacitor 31 is connected in series with switch 32 between the Vdd and Vss power supply rails. A rise time network 33 is also connected between the Vdd and Vss power supply rails and provides an output to the switch 32. The purpose of the rise time network 33 is activate the decoupling capacitor 31 by turning on switch 32 and provide a large current shunt between the Vdd and Vss power supply rails to allow an increase in effective chip capacitance to limit the rise of the Vdd power supply and avoid over voltage of circuits on the Vdd power rail.

Figure 4A:
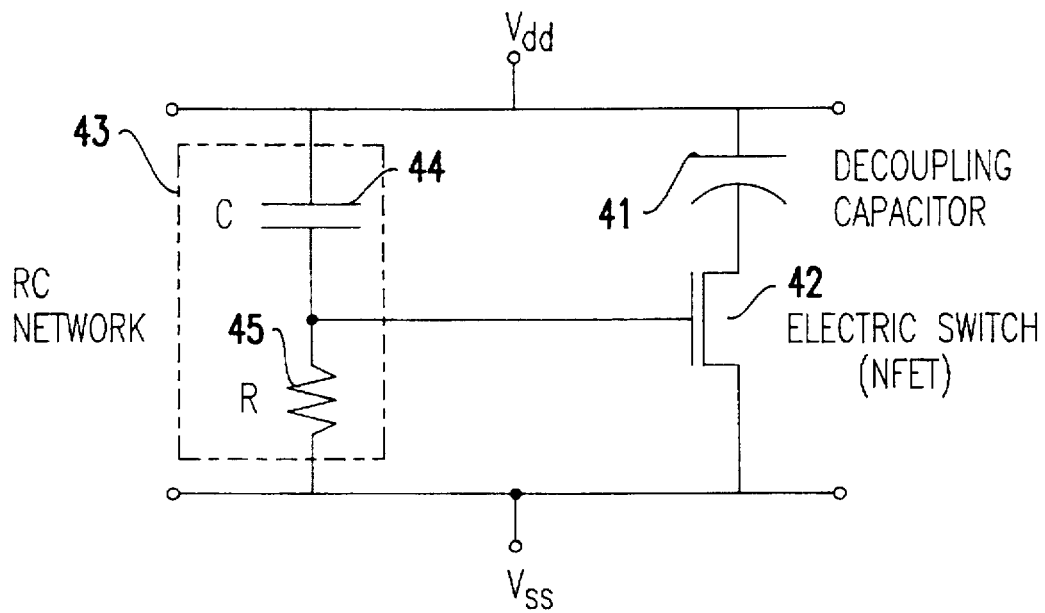
FIGS. 4A and 4B are schematic diagrams showing alternate implementations of the circuit of FIG. 3.
Figure 4B:
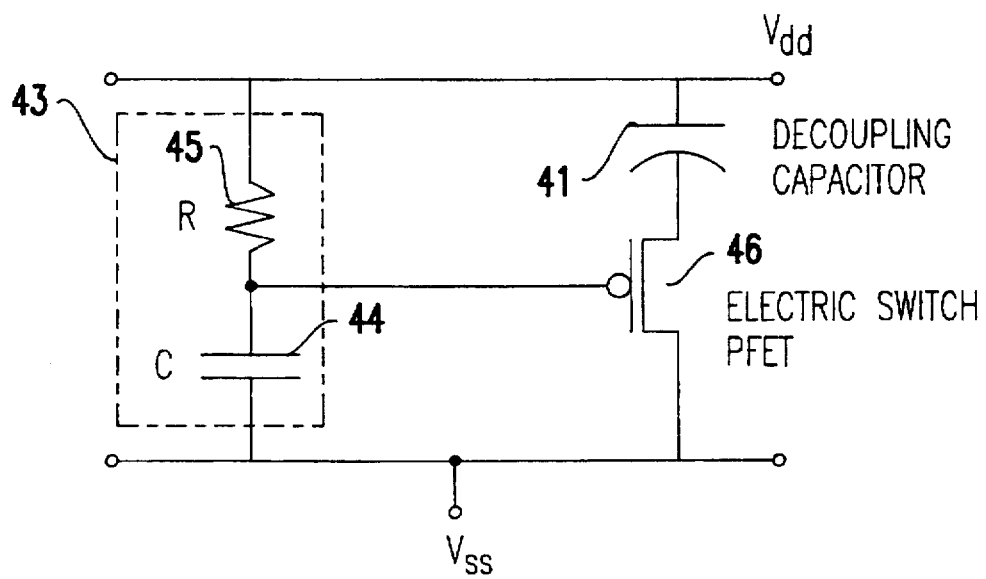

Specific implementations of the basic circuit are shown in FIGS. 4A. FIG. 4A shows a decoupling capacitor 41, an n-channel electronic switch (NFET) 42, and a resistor/capacitor (RC) network 43, and the Vdd and Vss power rails. The RC network is composed of a capacitor 44 and a resistor 45 connected in series between the Vdd and Vss supply rails. The junction of capacitor 44 and resistor 45 is connected to the gate of NFET 42. FIG. 4B shows a decoupling capacitor 41, a p-channel electronic switch 46 (PFET), the RC network 43, and the two power supply rails Vdd and Vss.

Note that in both these implementations, the RC network is composed of the resistor 45 and the capacitor 44 connected in series between the Vdd and Vss power supply rails. In both these implementations, the resistor element 45 can be any element that can serve as a resistor (e.g., an interconnect wire, an "on" transistor, a polysilicon wire, a tungsten wire, a silicon source/drain implant, a buried resistor element, etc.), and the capacitor element 44 can be any element that can serve as a capacitor (e.g., an interconnect wire, a transistor, two interconnect plates, an NFET in an n-well, a PFET in a p-well, a buried resistor element, etc.). The two power rails, labeled Vdd and Vss, can be any two power rails where current is desired to flow from the first to the second power rail. In the spirit of the invention, it can understood that this applies between external power rails Vcc to internal Vdd, Vcc to Vss, Vyy to Vxx where Vyy and Vxx can be any two rails (e.g., Vyy to Vxx where Vyy and Vxx can be any power rails of a chip).

Figure 5:
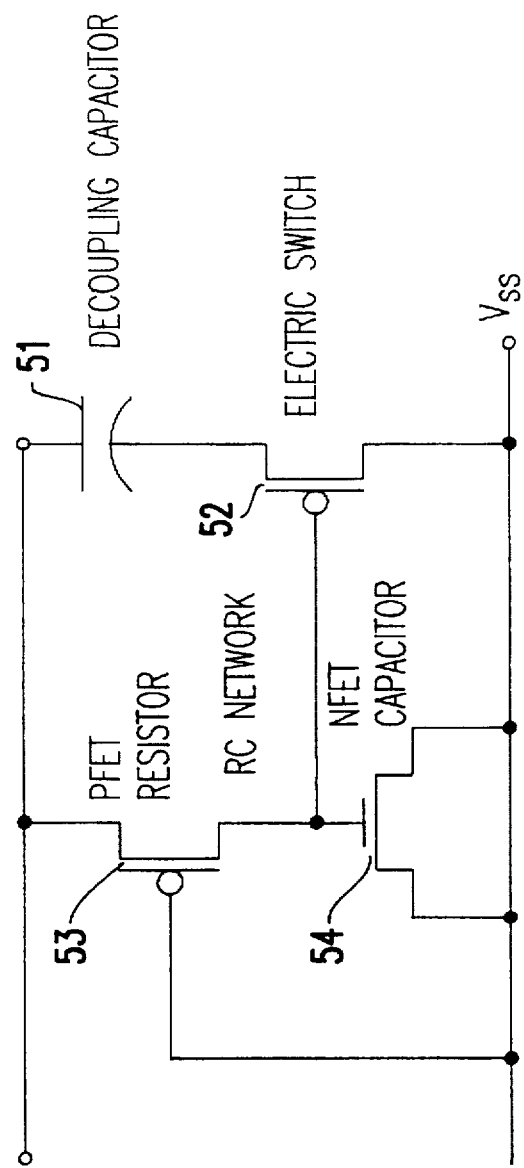
FIG. 5 is a schematic diagram of the decoupling capacitor implemented as an n-channel MOSFET device and the resistor implemented as a p-channel MOSFET device for the RC rise time network of the implementation of FIG. 4B.

A specific implementation of the basic circuit shown in FIG. 4B is illustrated by way of example in the schematic diagram of FIG. 5. The decoupling capacitor 51 is connected in series with a PFET 52 between the Vdd and Vss power supply rails of the chip. A second PFET 43 is connected between the Vdd power supply rail and the gates of PFET 42 and NFET 44. The gate of PFET 43 and the source and drain of the NFET 44 are connected to the Vss rail of the chip. The PFET 43 is used as a resistor element configuration, and the NFET 44 is used as a capacitor element. Thus, the PFET 43 and NFET 44 form a resistor/capacitor (RC) rise time network which functions to bias the PFET 42 "on" when the charge is such that the gate of the p-channel electronic switch is low.

The foregoing addresses the simplest implementation of the invention of turning on the electronic switch using an RC network. This implementation, however, does not address the further need to be able to switch out a failed decoupling capacitor. If a decoupling capacitor fails from electrostatic discharge (ESD) testing, a feedback network can be used to disengage the failed capacitor. This serves two purposes. First, if the capacitor is blown during an ESD event, it will disengage the capacitor so it will not impact the chip Idd leakage. Second, during ESD testing, if Iddq is a test requirement, then it will guarantee that failure of the capacitor does not impact ESD robustness of the product.

Figure 6:
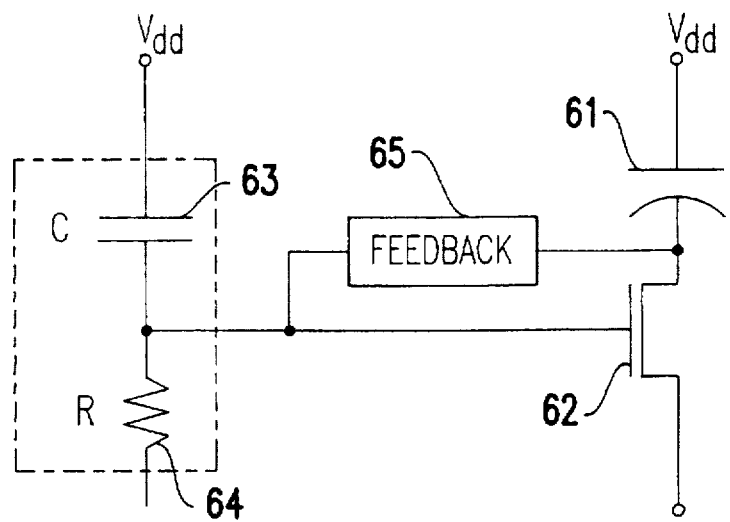
FIG. 6 is a block and schematic diagram of a modification of the basic circuit showing the addition of a feedback element between the decoupling capacitor and the electronic switch.

If the leakage through the capacitor is high, the node of the capacitor connected to the switch element goes high. Using a feedback element 65 between this node of the capacitor 61 and the gate of the NFET switch 62 as shown in FIG. 6, the switch 62 can be disabled so as to prevent the turn-on of the NFET switch during chip operation or direct current test. Although an n-channel implementation is shown in which the RC rise time network comprises capacitor 63 in series with resistor 64 between the Vdd and Vss power supply rails, it will be understood by those skilled in the art that a p-channel implementation is also possible. See, for example, FIGS. 4A and 4B.

Figure 7:
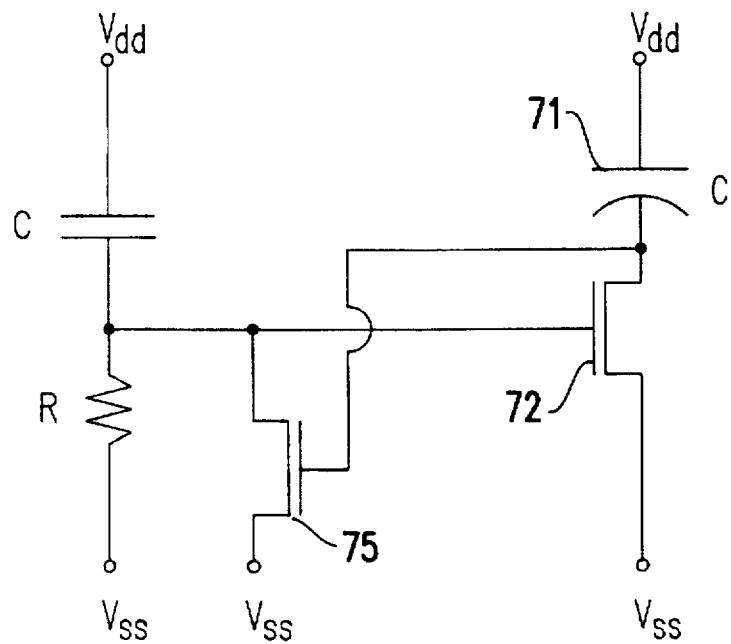
FIG. 7 is a schematic diagram showing a specific implementation of the circuit of FIG. 6 in which the feedback element is an n-channel FET.

An embodiment of the invention with a feedback element is shown in FIG. 7 where the feedback element is an NFET 75 connected between the gate of the NFET electronic switch 72 and the Vss power supply rail. The gate of the NFET 75 is connected to the low node of the decoupling capacitor 71. When the capacitor 71 is leaky, the gate voltage of the feedback NFET 75 rises. This turns on the feedback NFET 75, pulling the gate of the switch NFET 72 to low, hence turning off the switch 72 and preventing leakage.

Figure 8:
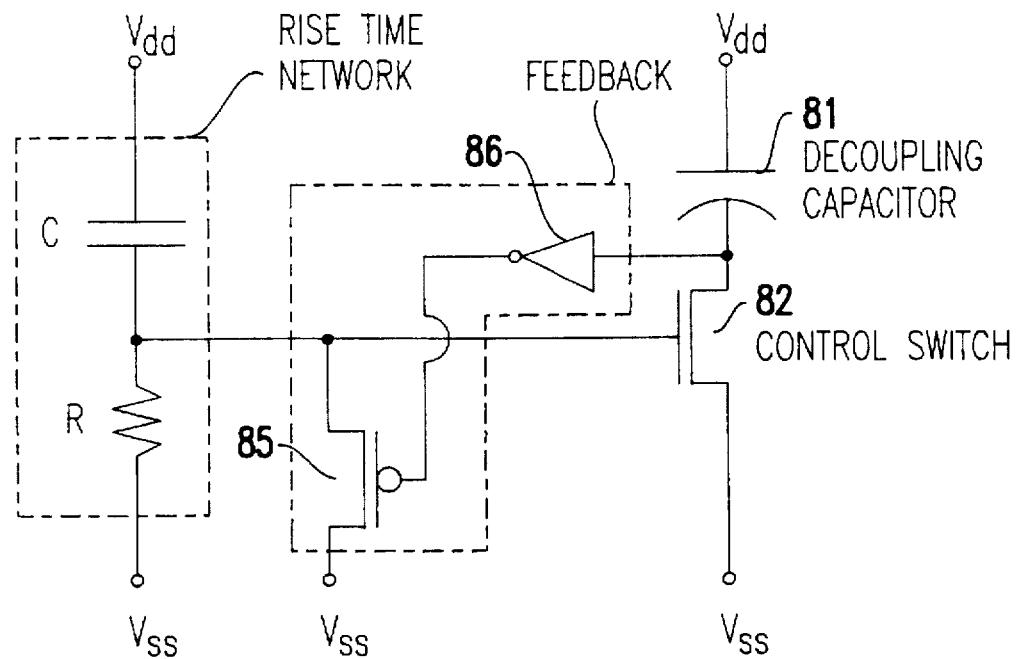
FIG. 8 is a schematic diagram showing an alternative implementation of the circuit in FIG. 6 in which the feedback element is an inverter and a p-channel FET.

A second embodiment of the feedback element is shown in FIG. 8. Here the feedback element is an inverter 86 followed by the PFET 85. The inverter is connected to the node between the decoupling capacitor 81 and the switch 82. The gate of the PFET 85 is connected to the inverter output. When the capacitor is leaky, a high voltage is input to the inverter which outputs a low voltage. This turns on the feedback PFET 85, pulling the gate of the switch FET 82 low, hence turning off the switch and preventing leakage.

Figure 9:
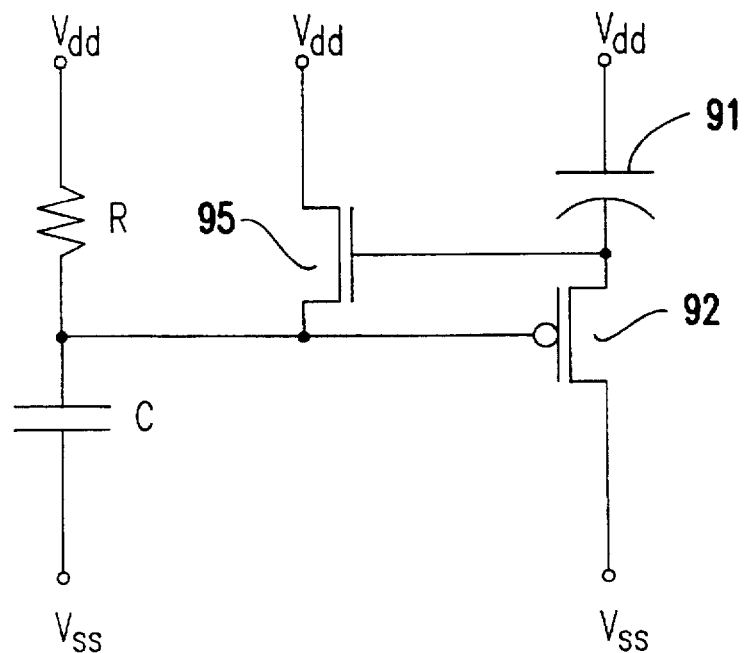
FIG. 9 is a schematic diagram showing a modification of the circuit of FIG. 6 in which the electronic switch is a p-channel FET and the feedback element is an n-channel FET.

A further variation is shown in FIG. 9 where the electronic switch is a PFET 92. In this case, the feedback element is an NFET 95 connected between the Vdd rail and the gate of the PFET 92. The node of between the decoupling capacitor and the PFET 92 is connected to the gate of the NFET 95. When the capacitor is leaky, the gate voltage of NFET 95 is high. This turns on the NFET 95, pulling the gate of the PFET 92 high, hence turning off the PFET electronic switch 92 and preventing leakage.

Figure 10:
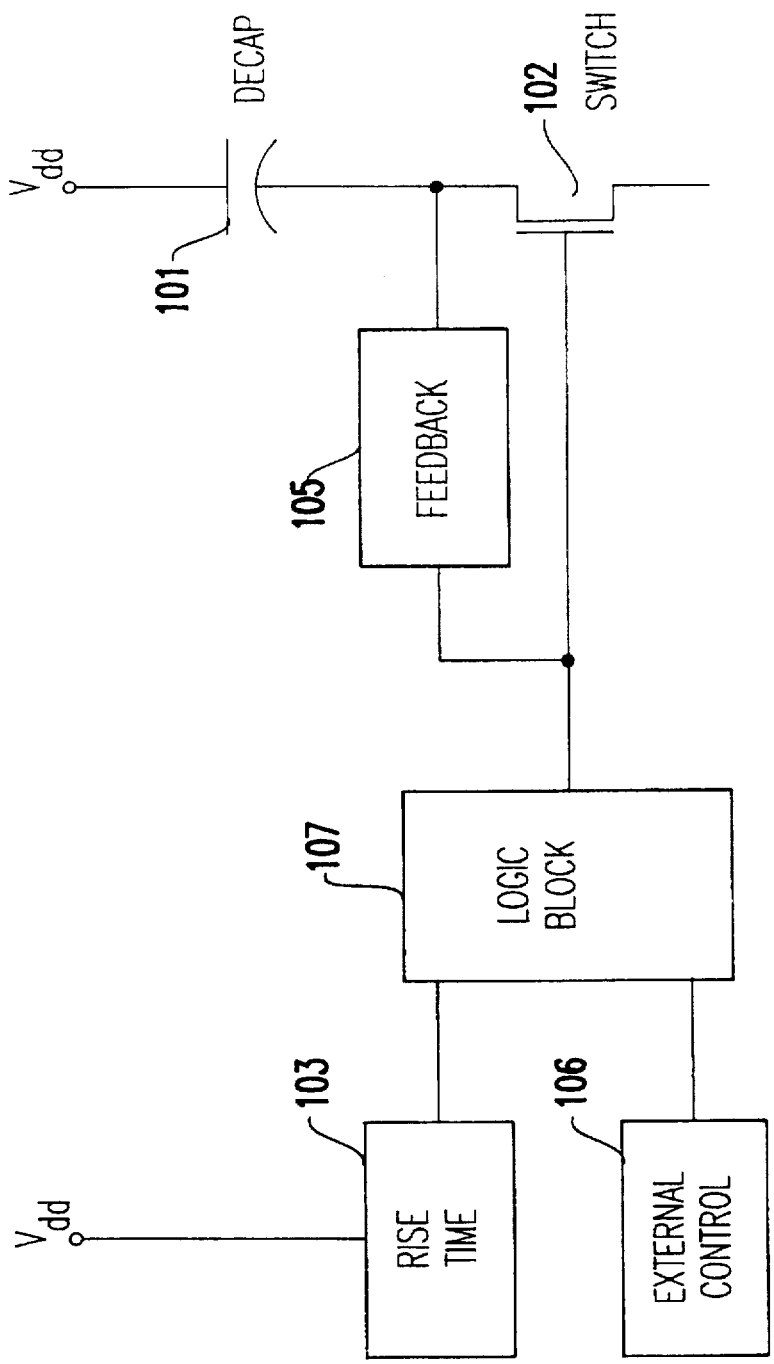
FIG. 10 is a block and schematic diagram showing a further modification of the basic invention which includes an external control for power-on-reset.

As a further modification of the basic invention, the capacitor can be used as a decoupling capacitor during chip operation and as a capacitor during electrostatic discharge (ESD) testing or during an ESD event. The basic circuit implementing this function is shown in FIG. 10. As in the circuit of FIG. 6, the circuit includes a decoupling capacitor 101, an electronic switch 102, a rise time network 103 and a feedback element 105. In addition, an external control 106 is provided for chip power-on-reset. A logic block 107 receives inputs from the rise time network 103 and the external control 106 and supplies a control signal to the gate of switch 102.

Figure 11:
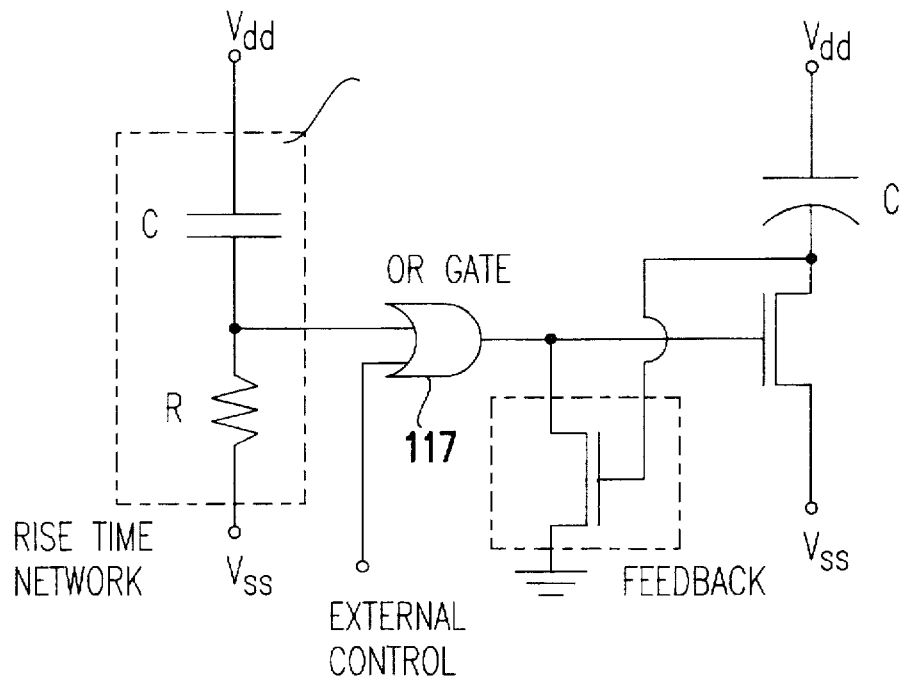
FIG. 11 is a schematic and logic diagram showing one implementation of the logic block in FIG. 10 as an OR gate.
Figure 12:
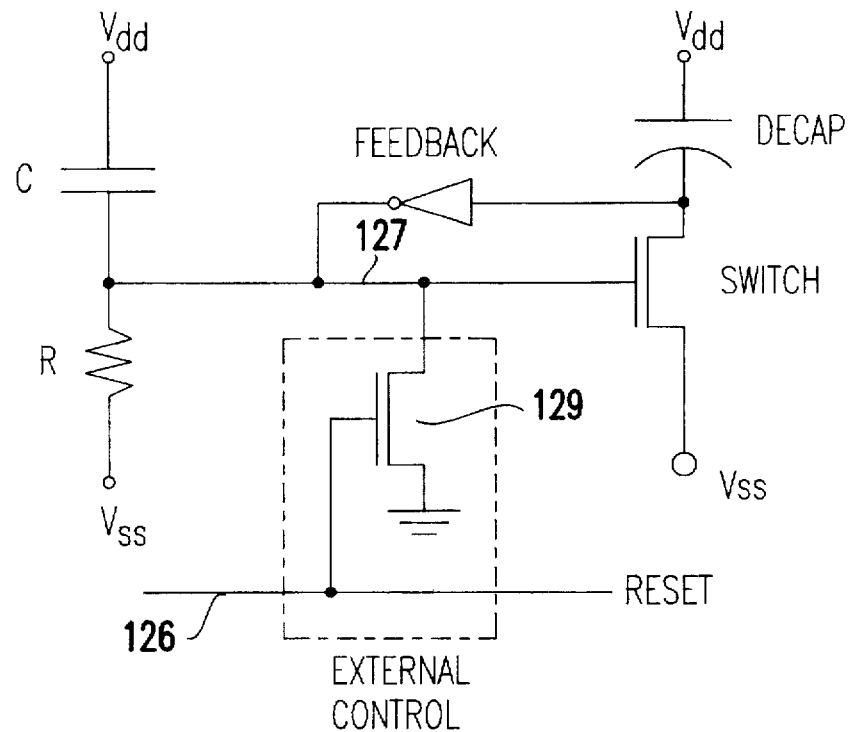
FIG. 12 is a schematic diagram showing the OR gate of FIG. 11 implemented as a dot OR structure and the external control as a reset signal.

As shown in FIG. 11, the logic block can be an OR gate 117. A specific implementation is shown in FIG. 12 where the OR gate is a dot OR connection 127 and the external connection is a reset line 128 connected to the gate of n-channel FET 129.

While the invention has been described in terms of preferred embodiments, those skilled in the art will recognize that the invention can be practiced with modification within the spirit and scope of the appended claims.

Having thus described my invention, what I claim as new and desire to secure by Letters Patent is as follows:

1. A circuit for an integrated circuit chip, comprising:
   a first power supply rail;
   a second power supply rail;
   a decoupling capacitor having a first electrode connected to the first power supply rail;
   an electronic switch connected between a second electrode of the decoupling capacitor and the second power supply rail; and
   a rise time network comprising a resistor element and a capacitor element, said rise time network being connected between the first power supply rail and the second power supply rail and having an output connected to said electronic switch to turn the electronic switch on in response to a change in current or voltage from an external signal.

2. The circuit recited in claim 1 wherein the electronic switch is a p-channel metal oxide semiconductor field effect transistor (MOSFET).

3. The circuit recited in claim 1 wherein the resistor element and the capacitor element of the rise time network are connected in series between the first power supply rail and the second power supply rail and a junction of the resistor element and the capacitor element are connected to the output of the rise time network.

4. The circuit recited in claim 3 wherein the resistor element is a p-channel transistor having a source connected to the first power supply rail, a drain connected to the electronic switch, and a gate connected to the second power supply rail.

5. The circuit recited in claim 3 wherein the resistor element is a metal resistor.

6. The circuit recited in claim 3 wherein the resistor element is an n-well implant.

7. The circuit recited in claim 3 wherein the resistor element is an n+ implant.

8. The circuit recited in claim 3 wherein the resistor element is a metal oxide semiconductor field effect transistor (MOSFET) device.

9. The circuit recited in claim 3 wherein the capacitor element is a metal oxide semiconductor field effect transistor (MOSFET) device.

10. The circuit recited in claim 3 wherein the capacitor element is a metal-insulator-metal interconnect structure.

11. The circuit recited in claim 3 wherein the capacitor element is a metal oxide semiconductor field effect transistor (MOSFET) having a source and drain connected to the second power rail and a gate connected to the electronic switch.

12. The circuit recited in claim 1, wherein said decoupling capacitor is enabled when the electronic switch is turned on to provide additional capacitance to the integrated circuit chip when the chip is in an un-powered state.

13. The circuit recited in claim 1, wherein neither said first power supply rail nor said second power supply rail is at a ground potential.

14. The circuit recited in claim 1, wherein said electronic switch is one of a bipolar transistor and a MOSFET, and wherein the output of the rise time network is connected to a base of said electronic switch if said electronic switch is a bipolar transistor or a gate of said electronic switch if said electronic switch is a MOSFET.

15. The circuit recited in claim 1, wherein said resistor element and said capacitor element have respective values of resistance and capacitance so that said rise time network has a desired RC time constant.

16. A circuit for an integrated circuit chip comprising:
   a first power supply rail;
   a second power supply rail;
   a decoupling capacitor having a first electrode connected to the first power supply rail;
   an electronic switch connected between a second electrode of the decoupling capacitor and the second power supply rail;
   an electronic switch connected between a second electrode of the decoupling capacitor and the second power supply rail;
   a rise time network comprising a resistor element and a capacitor element, said rise time network being connected between the first power supply rail and the second power supply rail and having an output connected to said electronic switch to turn the electronic switch on in response to a change in current or voltage from an external signal, said decoupling capacitor being enabled when the electronic switch is turned on to provide additional capacitance to the integrated circuit chip when the chip is in an un-powered state; and
   a feedback element connected to the second electrode of the decoupling capacitor and controlling the electronic switch to prevent the electronic switch from turning on when the decoupling capacitor falls or is leaky.

17. The circuit recited in claim 16 wherein the electronic switch is a first n-channel metal oxide semiconductor field effect transistor (MOSFET) and the feedback element is a second n-channel MOSFET having a gate connected to the second electrode of the decoupling capacitor, a source connected to the second power supply rail, and a drain connected to a gate of the first n-channel MOSFET.

18. The circuit recited in claim 16 wherein the electronic switch is an n-channel metal oxide semiconductor field effect transistor (MOSFET) and the feedback element comprises an inverter and a p-channel MOSFET, the inverter being connected to the second electrode of the decoupling capacitor, the p-channel MOSFET having a gate connected to an output of the inverter, a drain connected to the second power supply rail, and a source connected to a gate of the first n-channel MOSFET.

19. The circuit recited in claim 16 further comprising:
an external control; and
a logic block connected to receive inputs from the rise time network and the external control and providing an output to the electronic switch.

20. The circuit recited in claim 19 wherein the logic block is an OR gate.

21. The circuit recited in claim 16, wherein neither said first power supply rail nor said second power supply rail is at a ground potential.

* * * * *

UNITED STATES PATENT AND TRADEMARK OFFICE
CERTIFICATE OF CORRECTION

PATENT NO. : 5,789,964
DATED : August 4, 1998
INVENTOR(S) : Steven H. Voldman

It is certified that error appears in the above-identified patent and that said Letters Patent is hereby corrected as shown below:

On the title page, in the Attorney information, change "Schkurko" to --Shkurko--.

Signed and Sealed this

Twenty-ninth Day of September, 1998

Attest:

BRUCE LEHMAN

*Attesting Officer*       Commissioner of Patents and Trademarks